(12) United States Patent
Dusanapudi et al.

(10) Patent No.: US 10,489,259 B2
(45) Date of Patent: *Nov. 26, 2019

(54) REPLICATING TEST CASE DATA INTO A CACHE WITH NON-NATURALLY ALIGNED DATA BOUNDARIES

(71) Applicant: International Business Machines Corporation, Armonk, NY (US)

(72) Inventors: Manoj Dusanapudi, Bangalore (IN); Shakti Kapoor, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/887,968

(22) Filed: Feb. 2, 2018

(65) Prior Publication Data

US 2018/0157567 A1 Jun. 7, 2018

Related U.S. Application Data

(63) Continuation of application No. 15/065,279, filed on Mar. 9, 2016, now Pat. No. 9,959,182, which is a (Continued)

(51) Int. Cl.
*G06F 11/263* (2006.01)
*G06F 11/22* (2006.01)
(Continued)

(52) U.S. Cl.
CPC ............ *G06F 11/263* (2013.01); *G06F 3/065* (2013.01); *G06F 3/0617* (2013.01);
(Continued)

(58) Field of Classification Search
CPC ............... G06F 11/263; G06F 11/2236; G06F 11/2635; G06F 3/0617; G06F 3/065;
(Continued)

(56) References Cited

U.S. PATENT DOCUMENTS 5,165,029 A 11/1992 Sawai et al.
5,276,833 A 1/1994 Auvinen et al.
(Continued)

FOREIGN PATENT DOCUMENTS

| CN | 103140828 A | 6/2013 |
|---|---|---|
| EP | 0805390 B1 | 2/2003 |
| KR | 101467623 | 12/2014 |

OTHER PUBLICATIONS

Eichenberger et al., Vectorization for SIMD Architectures with Alignment Constraints. ACM, PLDI'04, p. 82-93, Jun. 2004.
(Continued)

*Primary Examiner* — Paul Contino
(74) *Attorney, Agent, or Firm* — Martin & Associates, LLC; Bret J. Petersen

(57) ABSTRACT

Data is replicated into a memory cache with non-naturally aligned data boundaries to reduce the time needed to generate test cases for testing a processor. Placing data in the non-naturally aligned data boundaries as described herein allows replicated testing of the memory cache while preserving double word and quad word boundaries in segments of the replicated test data. This allows test cases to be generated for a section of memory and then replicated throughout the memory and tested by a single test branching back and using the next strand of the replicated test data in the memory cache.

10 Claims, 6 Drawing Sheets

Related U.S. Application Data continuation of application No. 15/010,051, filed on Jan. 29, 2016, now Pat. No. 9,542,290.

(51) Int. Cl.

| | |
|---|---|
| *G06F 3/06* | (2006.01) |
| *G11C 29/10* | (2006.01) |
| *G11C 29/36* | (2006.01) |
| *G11C 29/08* | (2006.01) |
| *G11C 29/56* | (2006.01) |
| *G06F 12/0806* | (2016.01) |

(52) U.S. Cl.
CPC ........ *G06F 3/0683* (2013.01); *G06F 11/2236* (2013.01); *G06F 11/2635* (2013.01); *G11C 29/08* (2013.01); *G11C 29/10* (2013.01); *G11C 29/36* (2013.01); *G11C 29/56004* (2013.01); *G06F 12/0806* (2013.01); *G06F 2212/1024* (2013.01); *G06F 2212/45* (2013.01); *G06F 2212/608* (2013.01)

(58) Field of Classification Search
CPC ... G06F 3/0683; G06F 12/0806; G11C 29/08; G11C 29/10; G11C 29/36; G11C 29/56004

See application file for complete search history.

(56) References Cited

U.S. PATENT DOCUMENTS

| | | | |
|---|---|---|---|
| 5,287,481 A | 2/1994 | Lin | |
| 5,513,344 A | 4/1996 | Nakamura | |
| 5,537,572 A | 7/1996 | Michelsen et al. | |
| 5,539,878 A | 7/1996 | Kikinis | |
| 5,671,231 A | 9/1997 | Cooper | |
| 5,704,035 A | 12/1997 | Shipman | |
| 5,745,508 A | 4/1998 | Prohofsky | |
| 5,831,987 A | 11/1998 | Spilo | |
| 6,012,125 A | 1/2000 | Tran | |
| 6,044,478 A | 3/2000 | Green | |
| 6,070,238 A | 5/2000 | Feiste et al. | |
| 6,192,515 B1 | 2/2001 | Doshi et al. | |
| 6,594,731 B1 | 7/2003 | Hertwig et al. | |
| 6,658,534 B1 | 12/2003 | White et al. | |
| 6,754,857 B2 | 6/2004 | Liang | |
| 7,133,975 B1 | 11/2006 | Isaac et al. | |
| 7,203,872 B2 | 4/2007 | Frodsham et al. | |
| 7,254,509 B1 | 8/2007 | Johnson | |
| 7,647,539 B2 | 1/2010 | Bussa et al. | |
| 7,669,083 B2 | 2/2010 | Arora et al. | |
| 7,743,305 B2 | 6/2010 | Yamada | |
| 7,752,499 B2 | 7/2010 | Choudhury et al. | |
| 7,788,610 B2 | 8/2010 | Emek et al. | |
| 7,925,866 B2 | 4/2011 | Greenhalgh et al. | |
| 7,992,059 B2 | 8/2011 | Anvekar et al. | |
| 8,015,362 B2 | 9/2011 | Alexander et al. | |
| 8,161,432 B2 | 4/2012 | Wang et al. | |
| 8,161,440 B2 | 4/2012 | Emek et al. | |
| 8,645,669 B2 | 2/2014 | Alexander et al. | |
| 8,726,044 B2 | 5/2014 | Hameed et al. | |
| 9,317,460 B2 | 4/2016 | Greiner et al. | |
| 9,612,929 B1 | 4/2017 | Dusanapudi et al. | |
| 9,665,486 B2 | 5/2017 | Habermann et al. | |
| 9,892,039 B2 | 2/2018 | Luttrell et al. | |
| 10,169,180 B2 * | 1/2019 | Dusanapudi | ........ G06F 11/2635 |
| 2002/0040285 A1 | 4/2002 | Boehm | |
| 2003/0122584 A1 | 7/2003 | Boehm | |
| 2004/0078699 A1 | 4/2004 | Thompson et al. | |
| 2005/0071817 A1 | 3/2005 | DeWitt, Jr. et al. | |
| 2006/0248319 A1 | 11/2006 | Kadambi | |
| 2008/0126771 A1 | 5/2008 | Chen et al. | |
| 2008/0168562 A1 | 7/2008 | Haga et al. | |
| 2008/0258749 A1 | 10/2008 | Yamada | |
| 2009/0024886 A1 | 1/2009 | Arora et al. | |
| 2009/0070570 A1 | 3/2009 | Choudhury et al. | |
| 2009/0070632 A1 | 3/2009 | Bag et al. | |
| 2009/0089564 A1 | 4/2009 | Brickell et al. | |
| 2009/0070532 A1 | 5/2009 | Bussa et al. | |
| 2011/0078521 A1 | 3/2011 | He et al. | |
| 2011/0213926 A1 | 9/2011 | Ledford | |
| 2011/0276764 A1 | 11/2011 | Alexander et al. | |
| 2012/0079346 A1 | 3/2012 | Fukuda | |
| 2012/0102302 A1 | 4/2012 | Bansal et al. | |
| 2012/0221903 A1 | 8/2012 | Ohnuma | |
| 2013/0007425 A1 | 1/2013 | Cantin et al. | |
| 2013/0047140 A1 | 2/2013 | Shann et al. | |
| 2013/0339327 A1 | 12/2013 | Belmar et al. | |
| 2014/0032966 A1 | 1/2014 | Dusanapudi et al. | |
| 2014/0129773 A1 | 5/2014 | Habermann et al. | |
| 2014/0195786 A1 | 7/2014 | Gilkerson et al. | |
| 2015/0026445 A1 | 1/2015 | Bansal et al. | |
| 2015/0134933 A1 | 5/2015 | Holm et al. | |
| 2015/0143057 A1 | 5/2015 | Pavlou et al. | |
| 2015/0221396 A1 | 8/2015 | Subramaniam et al. | |
| 2015/0234700 A1 | 8/2015 | Qin et al. | |
| 2015/0347134 A1 | 12/2015 | Gschwind et al. | |
| 2016/0162381 A1 | 6/2016 | Hendrickson et al. | |
| 2016/0349322 A1 | 12/2016 | Shibahara et al. | |
| 2018/0146454 A1 | 5/2018 | Wang et al. | |
| 2019/0198132 A1 * | 6/2019 | Dusanapudi | ........... G11C 29/38 |

OTHER PUBLICATIONS

Adir et al., Genesys-Pro: Innovations in Test Program Generation for Functional Processor Verification. IEEE Design & Test of Computers, p. 84-93, 2004.

English Abstract of Korean Patent No. 101467623.

Zhu et al., "Class-based Cache Management for Dynamic Web Content." Twentieth Annual Joint Conference of the IEEE Computer and Communications Societies, IEEE INFOCOM 2001.

Lundqvist, Thomas, Data Cache Timing Analysis with Unknown Data Placement. vol. 9. Technical Report 02-11, Department of Computer Engineering, Chalmers University of Technology, Göteborg, Sweden, 2002.

McKinney et al. "DECchip 21066: the Alpha AXP Chip for Cost-Focused Systems." Compcon Spring'94, IEEE, 1994.

Maman, et al. "Reusable On-Chip System Level Verification for Simulation Emulation and Silicon." 2006 IEEE International High-Level Design Validation and Test Workshop, 2006.

Kadry et al. "Improving Post-silicon Validation Efficiency by Using Pre-generated Data." Hardware and Software: Verification and Testing, Springer International Publishing, p. 166-181, 2013.

English Abstract for Chinese Patent CN103140828A, Jun. 5, 2013.

Lozano et al., A Deeply Embedded Processor for Smart Devices, Smart Computing Workshops (SMARTCOMP 2014) p. 79-86, 2014.

IBM, "Method and apparatus for branch recovery in out of order dispatch and out of order retire instruction stream environment", IPCOM000125694D, Jun. 13, 2005.

Disclosed Anonymously, :Method and System for Defining a Stack Model and Tracking Changes to a Test Execution Stack, IPCOM000199695D, Sep. 15, 2010.

Disclosed Anonymously, "Method and System for Controlling Cache Interaction Among Arbitrary Hardware Verification Tools", IPCOM000196688D, Jun. 11, 2010.

Gay et al., Stack Allocating Objects in Java, retrieved from: citeseerx.ist.psu.edu, Jan. 1999.

Disclosed Anonymously, "A method and system to intelligently evolve test cases", IPCOM000240119D, Jan. 5, 2015.

Mutlu, Onur. 15-7 40/18-7 40 Computer Architecture Lecture 24: Prefetching. Carnegie Melon University, 2011.

Jegou, Yvon, and Olivier Temam. "Speculative Prefetching", Proceedings of the 7th International Conference on Supercomputing, ACM, 1993.

Prefetch Distance. High Performance Computer Architectures: A Historical Perspective. [retrieved on Mar. 19, 2018]. Retrieved from the Internet <URL: http ://homepages.inf.ed.ac.uk/cgi/mi/comp-arch.pl ?Stores/pref-dist.html,Stores/pref-dist-f.html,Stores/menu-pre.html>, 1996.

(56) References Cited

OTHER PUBLICATIONS

Dusanapudi et al., "Replicating Test Case Data Into a Cache With Non-Naturally Aligned Data Boundaries" U.S. Appl. No. 15/010,051, filed Jan. 29, 2016.
Dusanapudi et al., "Replicating Test Case Data Into a Cache With Non-Naturally Aligned Data Boundaries" U.S. Appl. No. 15/065,279, filed Mar. 9, 2016.
Dusanapudi et al., "Replicating Test Case Data Into a Cache With Non-Naturally Aligned Data Boundaries" U.S. Appl. No. 15/244,799, filed Aug. 23, 2016.
Dusanapudi et al., "Replicating Test Code and Test Data Into a Cache With Non-Naturally Aligned Data Boundaries" U.S. Appl. No. 15/152,430, filed May 11, 2016.
Dusanapudi et al., "Replicating Test Case Data Into a Cache and Cache Inhibited Memory" U.S. Appl. No. 15/207,669, filed Jul. 12, 2016.
Dusanapudi et al., "Testing Speculative Instruction Execution With Test Cases Placed in Memory Segments With Non-Naturally Aligned Data Boundaries" U.S. Appl. No. 15/344,768, filed Nov. 7, 2016.
Dusanapudi et al., "Stress Testing a Processor Memory With a Link Stack" U.S. Appl. No. 15/458,118, filed Mar. 14, 2017.
Dusanapudi et al., "Stress Testing a Processor Memory With a Link Stack" U.S. Appl. No. 15/804,512, filed Nov. 6, 2017.
IBM, Appendix P—List of IBM Patents or Patent Applications Treated As Related, dated Jan. 31, 2018.

* cited by examiner

REPLICATING TEST CASE DATA INTO A CACHE WITH NON-NATURALLY ALIGNED DATA BOUNDARIES

BACKGROUND

1. Technical Field

This disclosure generally relates to computer hardware testing and development, and more specifically relates to a system and method for replicating test data into memory cache with non-naturally aligned data boundaries while preserving sub-segments with aligned boundaries in the segments of the replicated test data.

2. Background Art

Processor testing took exist whose goal is to generate the most stressful test case for a processor. In theory, the generated test case should provide maximum test coverage and should be able to stress various timing scenarios on the processor, including the memory. Building test cases can be extremely costly in time and resources such that building efficient test cases is an important part of processor testing.

Many processors have restrictions on alignment for memory operations. For example, some power processors allow different alignment boundaries in memory for different instructions while in different modes like Cache Inhibited, Little Endian etc. With these complexities on boundary restrictions, it's very difficult to generate test cases for the different alignment boundaries for each of the instructions. Moreover, testing all valid boundaries for an instruction is very important and multiple test cases for multiple boundaries would have the overhead of generation and simulation in case of reference model checking. Prior art test case generation was extremely labor intensive to test the different alignment boundaries while preserving boundaries where needed.

BRIEF SUMMARY

Data is replicated into a memory cache with non-naturally aligned data boundaries to reduce the time needed to generate test cases for testing a processor. Placing data in the non-naturally aligned data boundaries as described herein allows replicated testing of the memory cache while preserving double word and quad word boundaries in segments of the replicated test data. This allows test cases to be generated for a section of memory and then replicated throughout the memory and tested by a single test branching back and using the next slice of the replicated test data in the memory cache.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

Figure 4:
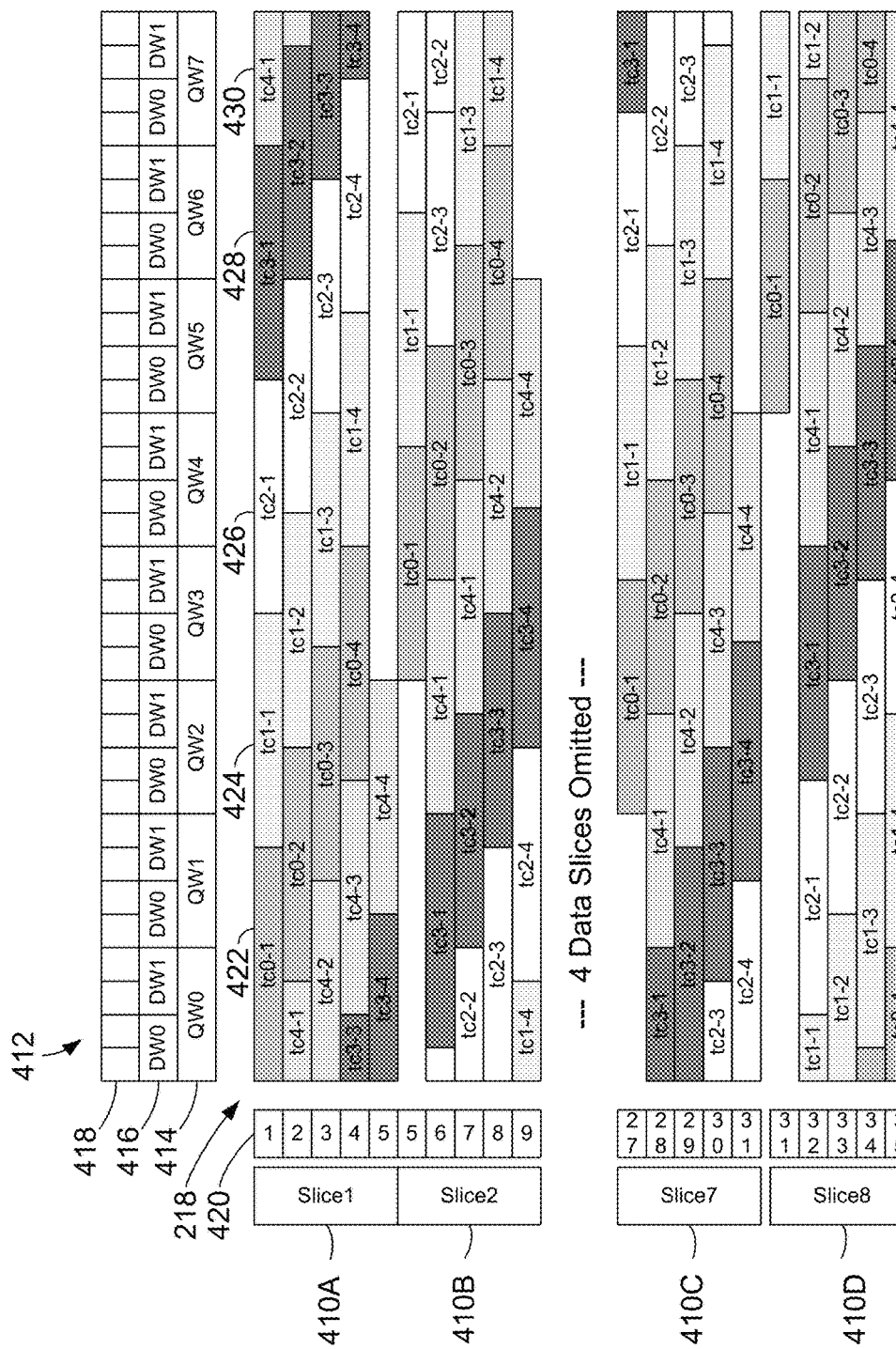
FIG. 4 illustrates successive slices of replicated test data with non-naturally aligned data boundaries stored in a memory cache.
Figure 5:
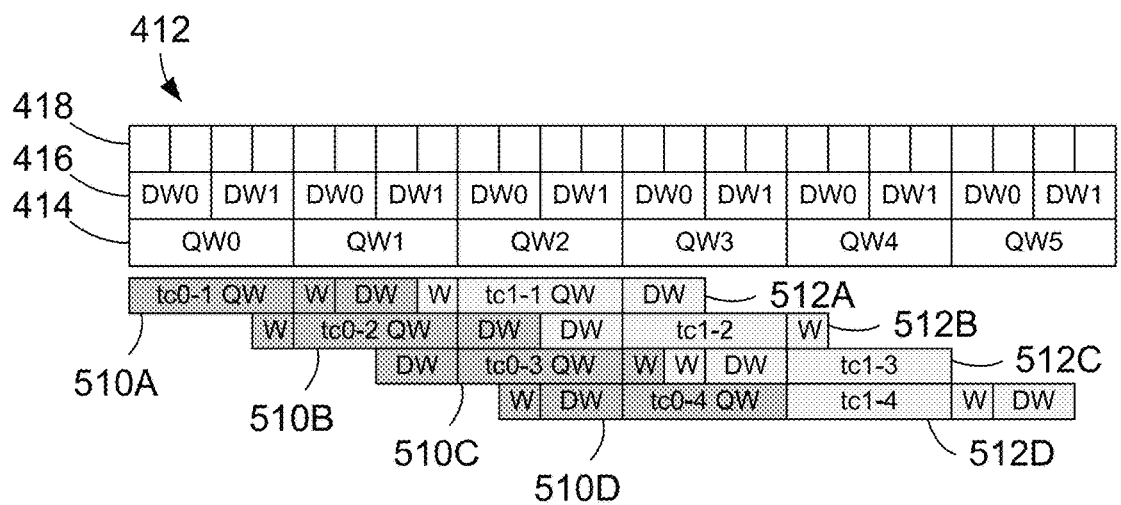
Figure 6:
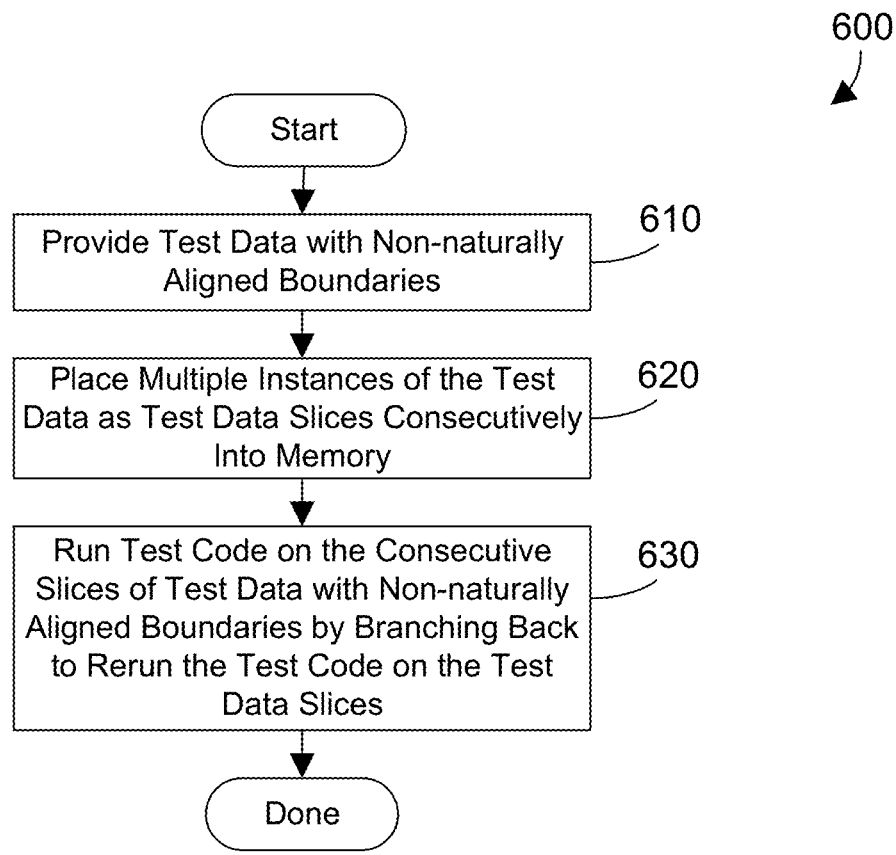
Figure 7:
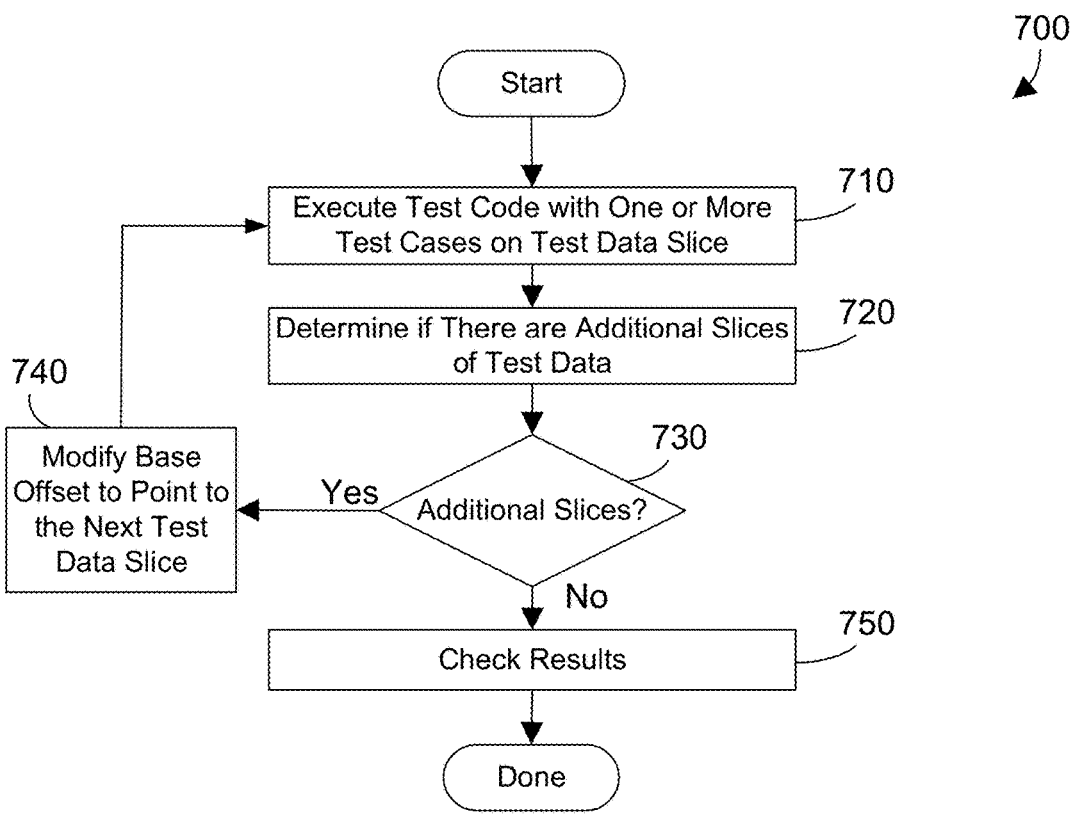

FIG. 5 further illustrates the data in FIG. 4 having non-naturally aligned data boundaries;

FIG. 6 is a flow diagram of a method for reducing the time needed to generate test cases for testing a processor by replicating test data and placing slices of the test data into a memory cache where the slices of the replicated test data have non-naturally aligned data boundaries; and FIG. 7 is a flow diagram of a specific method for step 630 in FIG. 6.

DETAILED DESCRIPTION

The disclosure and claims herein relate to a system and method for replicating test data into a memory cache with non-naturally aligned data boundaries to reduce the time needed to generate test cases for testing a processor. Placing data in the non-naturally aligned data boundaries as described herein allows replicated testing of the memory cache while preserving double word and quad word boundaries in segments of the replicated test data. This allows test cases to be generated for a section of memory and then replicated throughout the memory and tested by a single test branching back and using the next slice of the replicated test data in the memory cache.

Figure 1:
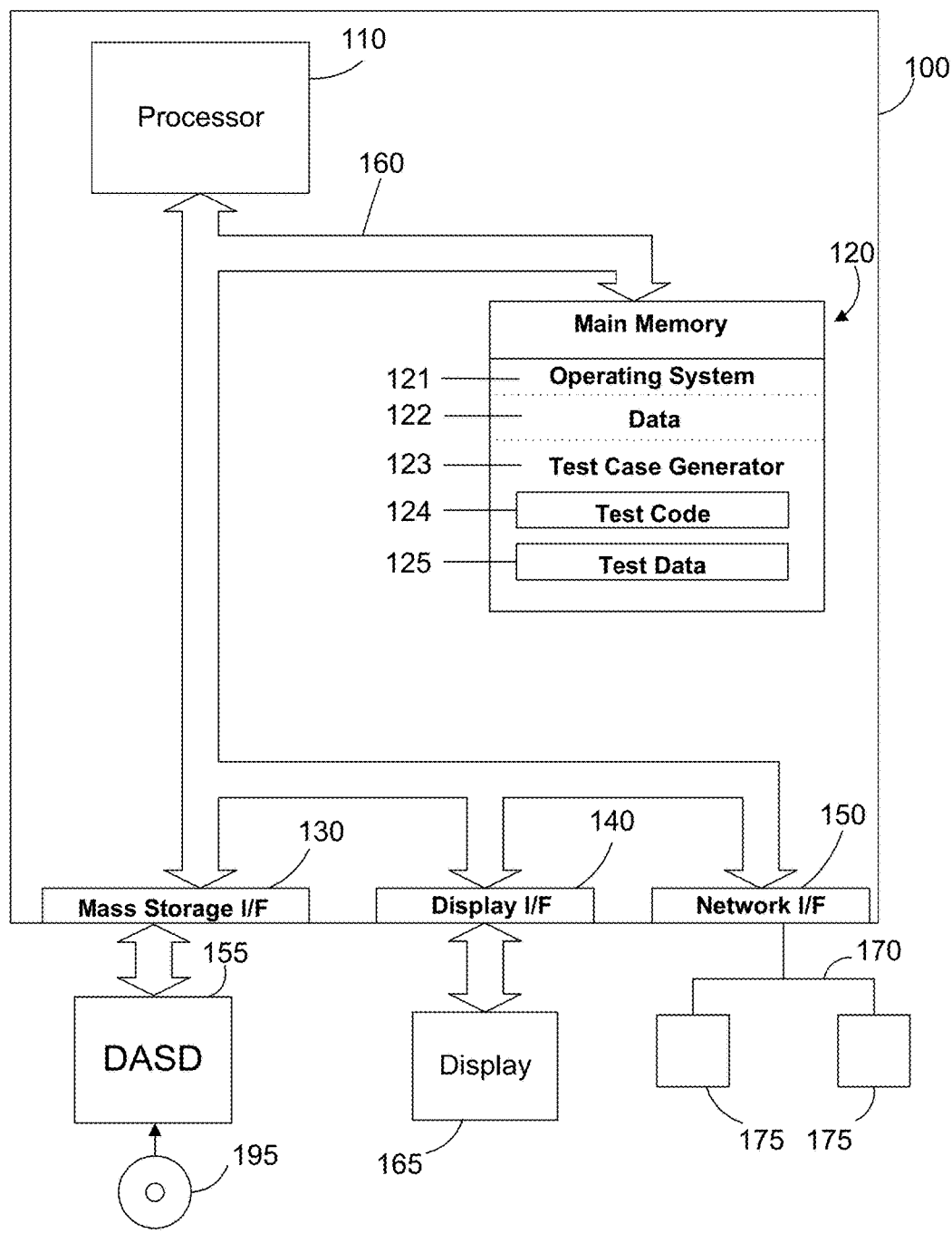
FIG. 1 is a block diagram a computer system with a test case generator as described herein to generate test data in a data cache with non-naturally aligned data boundaries.

Referring to FIG. 1, a computer system 100 is one suitable implementation of a computer system that is capable of performing the computer operations described herein including a test case generator for generating test cases for verifying and validating a processor design and/or a test case executor as described herein. Computer system 100 is a computer which can run multiple operating systems including the IBM i operating system. However, those skilled in the art will appreciate that the disclosure herein applies equally to any computer system, regardless of whether the computer system is a complicated multi-user computing apparatus, a single user workstation, laptop, phone or an embedded control system. As shown in FIG. 1, computer system 100 comprises one or more processors 110. The processor 110 may contain a branch tracking unit 112 as described further below. The computer system 100 further includes a main memory 120, a mass storage interface 130, a display interface 140, and a network interface 150. These system components are interconnected through the use of a system bus 160. Mass storage interface 130 is used to connect mass storage devices with a computer readable medium, such as direct access storage devices 155, to computer system 100. One specific type of direct access storage device 155 is a readable and writable CD-RW drive, which may store data to and read data from a CD-RW 195. Some devices may have a removable memory card or similar for a direct access storage device 155 instead of the CD-RW drive.

Main memory 120 preferably contains an operating system 121. Operating system 121 is a multitasking operating system known in the industry as IBM i; however, those skilled in the art will appreciate that the spirit and scope of this disclosure is not limited to any one operating system. The memory 120 further includes data 122 and a test case generator 123. The memory 120 also includes test code 124 and test data 125 which is typically created by the test case generator 123.

Computer system 100 utilizes well known virtual addressing mechanisms that allow the programs of computer system 100 to behave as if they only have access to a large, single storage entity instead of access to multiple, smaller storage entities such as main memory 120 and DASD device 155. Therefore, while operating system 121, data 122, test case generator 123, test code 124 and test data 124 are shown to reside in main memory 120, those skilled in the art will recognize that these items are not necessarily all completely contained in main memory 120 at the same time. It should also be noted that the term "memory" is used herein generically to refer to the entire virtual memory of computer system 100, and may include the virtual memory of other computer systems coupled to computer system 100.

Processor 110 may be constructed from one or more microprocessors and/or integrated circuits. Processor 110 executes program instructions stored in main memory 120. Main memory 120 stores programs and data that processor 110 may access. When computer system 100 starts up, processor 110 initially executes the program instructions that make up operating system 121 and later executes the program instructions that make up the test case generator 123 to generate the test code and the test data as directed by a user.

Although computer system 100 is shown to contain only a single processor and a single system bus, those skilled in the art will appreciate that the system may be practiced using a computer system that has multiple processors and/or multiple buses. In addition, the interfaces that are used preferably each include separate, fully programmed microprocessors that are used to off-load compute-intensive processing from processor 110. However, those skilled in the art will appreciate that these functions may be performed using I/O adapters as well.

Display interface 140 is used to directly connect one or more displays 165 to computer system 100. These displays 165, which may be non-intelligent (i.e., dumb) terminals or fully programmable workstations, are used to provide system administrators and users the ability to communicate with computer system 100. Note, however, that while display interface 140 is provided to support communication with one or more displays 165, computer system 100 does not necessarily require a display 165, because all needed interaction with users and other processes may occur via network interface 150, e.g. web client based users.

Network interface 150 is used to connect computer system 100 to other computer systems or workstations 175 via network 170. Network interface 150 broadly represents any suitable way to interconnect electronic devices, regardless of whether the network 170 comprises present-day analog and/or digital techniques or via some networking mechanism of the future. In addition, many different network protocols can be used to implement a network. These protocols are specialized computer programs that allow computers to communicate across a network. TCP/IP (Transmission Control Protocol/Internet Protocol) is an example of a suitable network protocol.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
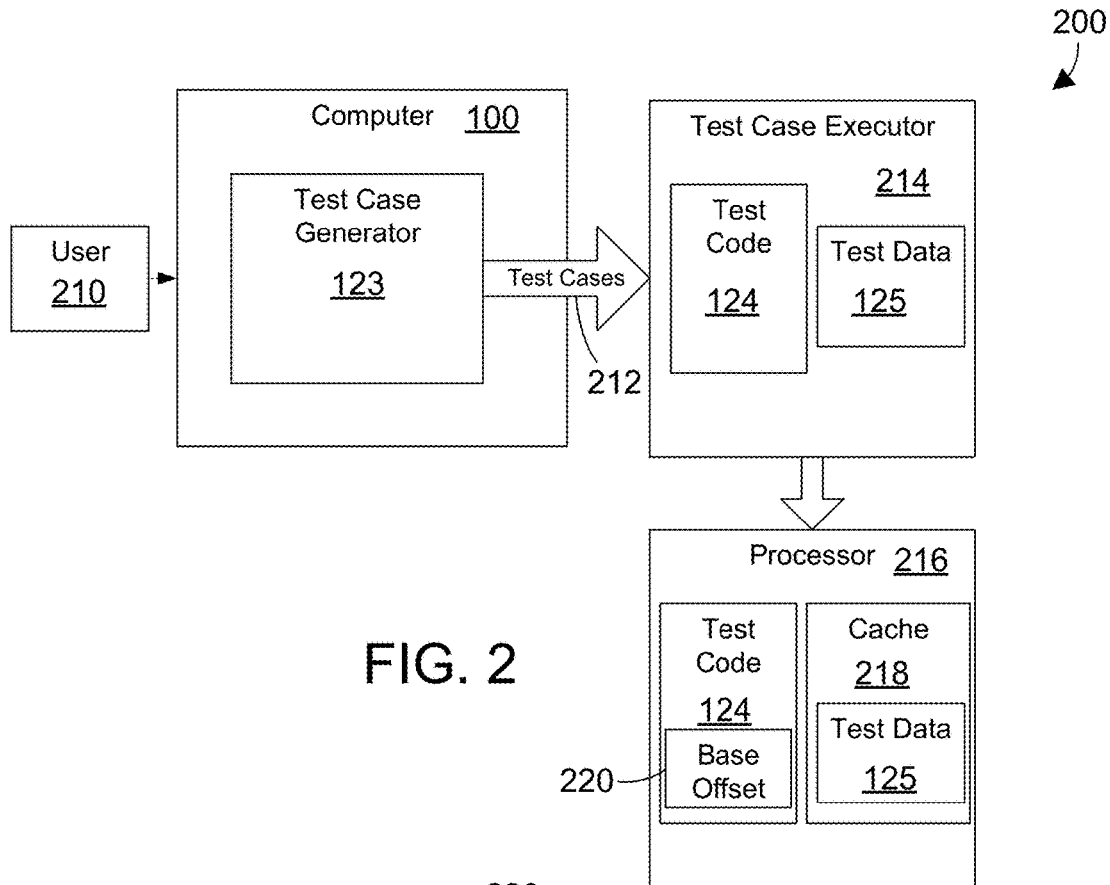
FIG. 2 is a simplified block diagram of a system for testing data in a data cache with non-naturally aligned data boundaries.

FIG. 2 illustrates a simplified block diagram of a system 200 for reducing the time needed to generate test cases for testing a processor by replicating test data and placing slices of the test data into a memory cache where the slices of the replicated test data have non-naturally aligned data boundaries. A user 210 or an operator uses the test case generator 123 to provide tests cases 212 to a test case executor 214. The test case generator 123 and the test case executor 214 operate in a manner similar to the prior art except as described herein. The test cases 212 include test code 124 and test data 125. The test case executor 214 loads the test code 124 into a processor 216 to verify and validate the processor design. The test code 124 uses a base offset address 220 to access the test data as described further below. The test case executor 214 further loads the test data 125 into a cache 218 of the processor 216. The test case executor 214 replicates the test data 125, placing multiple slices of the test data into the cache as described further below.

Figure 3:
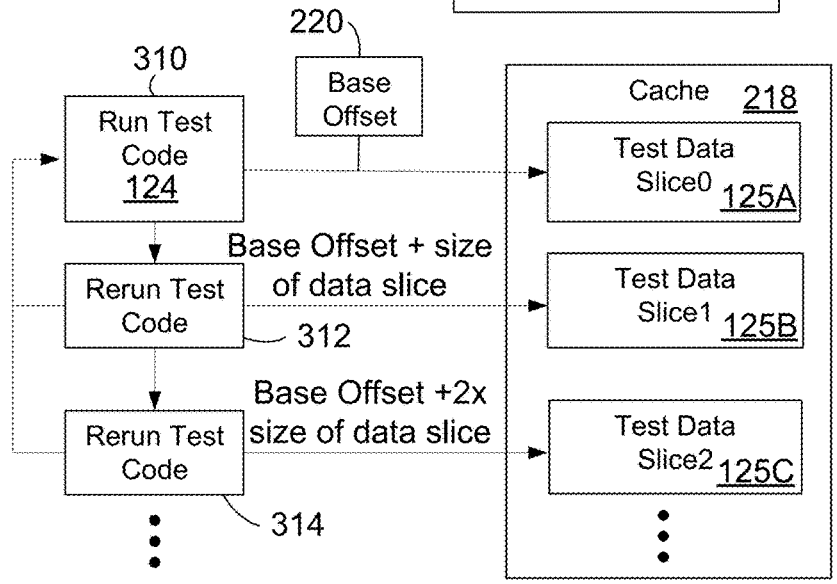
FIG. 3 is a simplified example of a test case branching back and using successive slices of replicated test data with non-naturally aligned data boundaries.

FIG. 3 is a simplified example of test code branching back and using successive slices of replicated test data with non-naturally aligned data boundaries. The test case executor 214 loads the test code 124 into a memory associated with the processor 216 to verify and validate the processor design. The test case executor 214 further loads the test data 125 into a cache 218 of the processor 216. In the illustrated example, the test data 125 is loaded into three consecutive slices of memory. Test data slice0 125A is loaded first, followed by test data slice1 125B and test data slice2 125C. As would be understood by one of ordinary skill in the art, additional slices could be loaded into memory; however only three test data slices are shown here for illustration purposes. In contrast to the prior art, the cache 218 can be loaded with replicated slices of the test data as described in more detail below to greatly simplify test case generation.

Again referring to FIG. 3, the test code 124 is run a first time 310 using the base offset 220 to run test cases using the test data slice0 125A. The base offset 220 is an address pointer used by the test code 124 to address the test data 125 and initially points to the test data slice0 125A. The test code 124 runs a second time 312 using the base offset 220 plus the size of the test data slice to run test cases using the test second test data slice1 125B. Similarly, the test code 124 runs a third time 314 using the base offset 220 plus two times the size of the test data slice to run test cases using the third test data slice2 125C. In a similar manner, the test data 124 can be run multiple times to test each replication of the test data 125 stored in the cache 218.

FIG. 4 illustrates additional detail of successive slices of replicated test data with non-naturally aligned data boundaries. FIG. 4 represents a simplified representation of a portion of the memory cache 218 introduced above. In the illustrated example, the cache 218 illustrates four replicated slices 410 of test data (described further below). The table 412 above the cache data illustrates how the data in the cache is divided. A line of data in the cache is divided into eight quad words 414. The quad words 414 are labeled QW0 through QW7. Each quad word 414 is divided into two double words 416. The double words for each quad word are labeled DW0 and DW1. Each double word 416 is further divided into two words 416 (not labeled). In this example, each word is four bytes of data. Thus each cache line of data having eight quad words is 128 bytes of data. Thus the cache 218 is divided into lines of data 420 with 128 bytes in each line. In the illustrated portion of cache 218 shown in FIG. 4, lines 1-9 and 27-35 are shown with the line number 420 shown for each line at the left side of the drawing.

Again referring to FIG. 4, the data represented in the cache 128 is divided into slices 410 as shown. For simplification of the drawing, only four slices of the data are actually shown. Slices 3 through 6 are omitted from the drawing but follow the same pattern as the other slices. Slice1 410A begins on line1 of the data cache and ends near the middle of line 5. Line 5 is shown twice at the left of the drawings. This is done for illustration so that it can be clearly seen where slice1 410A ends and slice2 410B begins. In the cache there is actually only one line of memory designated as line 5. Slice2 410B begins at the end of slice1 410A near the middle of line 5 and ends near the end of line 9. Slice7

410C begins at the end of slice6 (not shown) near the middle of line 27 and ends near the end of line 31. Slice8 410D begins at the end of slice7 410C near the middle of line 31 and ends at the end of line 35.

Again referring to FIG. 4, each slice of data 410 includes several strands of test cases. In this example, there are five strands of test cases (tc0 through tc4) divided into four segments each. The segments of each strand are shown with the same shading in FIG. 4. The segment of the strand is indicated by the number after the dash. Thus tc0-1 422 is the first segment of test case zero, tc1-1 424 is the first segment of test case one, tc2-1 426 is the first segment of test case 2, tc3-1 428 is the first segment of test case 3 and tc4-1 430 is the first segment of test case four. Test case zero (tc0) includes tc0-1, tc0-2, tc0-3 and tc0-4. Similarly the other test case strands include four segments. As can be seen using the table 412 above the data 218, each of the segments of test data is seven words long. It is important to note that the seven word length of the segments means that each of the test cases are on non-naturally aligned word boundaries. In this example this means that the beginning and end of each of the test case segments does not line up with 32 byte, cache line (128 byte) and page crossing boundaries. For example, the page crossing boundary 432 is within the test case tc1-1 at the boundary between line 31 and line 32 as shown in FIG. 4. Since the segments are non-naturally aligned, after replication alignment boundaries change for tests on subsequent segments to allow more robust testing of the processor using the same repeated test code with different slices of the data. In cases, where alignment boundaries need to be respected for a few instructions, these instructions are placed in sub-segments with special alignment locations so that they preserve alignment even after replication and re-execution on new segments as described below.

FIG. 5 further illustrates a portion of the data in FIG. 4 having non-naturally aligned data boundaries. FIG. 5 illustrates the data in the first two strands of the five strands of test cases shown in FIG. 4, namely tc0 510 and tc1 512. Test case zero (tc0) 510 includes four segments 510A, 510B, 510C and 510D. Similarly, test case one (tc1) 512 includes four segments 512A, 512B, 512C and 512D. As described above, each segment of the test cases is seven words long. The test case segment is divided into three sub-segments. In this example, the sub-segments include a quad word, a double word and a single word for a total of seven words. The order of the sub-segments changes for each segment in the test case strand in order that the test cases within the strings can observe word boundaries where needed. The first segment 510A of test case zero (tc0) has a quad word followed by a word and then a double word. In the next segment of tc0 510B there is a word, a quad word and then a double word. In the next segment of tc0 510C there is a double word, a quad word and then a single word. In the final segment of tc0 510D there is a single word, a double word and then the quad word. Similarly the tc1 alternates the single word, double word and quad word in subsequent segments as shown in 512A, 512B, 512C and 512D.

In the example described above, each segment of the test cases has seven words to insure that the test case data has non-naturally aligned data boundaries. By having non-naturally aligned data boundaries for each segment of the slice of test data testing can be done on the replicated test cases to test various boundaries. These boundaries include 32 byte boundaries, cache line boundaries (128 bytes) and page crossing boundaries. The test case segment is divided into sub-segments of word, double word and quad word and the order of the sub-segments changes for each segment in the test case strand. Dividing into sub-segments and changing of the order of the sub-segments insures that the data for test cases within the sub-strings can observe and preserve double word and quad word boundaries where needed. Using non-naturally aligned data boundaries with replicated code insures that all types of segments will cross the boundaries at some replication of the test data. This allows testing of the boundaries without using special code to look at the restrictions of a particular segment for each of the boundaries.

The examples described above illustrate a preferred test case segment with 7 words to achieve non-naturally aligned data boundaries. Other non-naturally aligned data boundaries could include other odd numbers such as 5, 9, 11, etc. A combination of word, double word and quad word could be chosen as sub-segments for these segments similar to the described example. For example, for a segment with 9 words, a quad word, two double words and a word would achieve the correct number of sub-segments for 9 words. The sub-segments could be changed for each segment in a strand as described above for the 7 word example.

Referring to FIG. 6, a method 500 shows one suitable example for reducing the time needed to generate test cases for testing a processor by replicating test data and placing slices of the test data into a memory cache where the slices of the replicated test data have non-naturally aligned data boundaries. Portions of method 600 are preferably performed by the test case generator 123 shown in FIG. 1 and the test case executor 214 shown in FIG. 2. First, provide test data with non-naturally aligned boundaries (step 610). Next, place multiple instances of the test data as test data slices consecutively into memory (step 620). Run test code on the consecutive slices of data with non-naturally aligned boundaries by branching back to rerun the test code on the consecutive test data slices (step 630). Method 600 is then done.

FIG. 7 shows one suitable example of a method 700 for running test code on the consecutive slices of data with non-naturally aligned boundaries by branching back to rerun the test code on the consecutive test data slices. Method 700 thus shows a suitable method for performing step 630 in method 600. First, execute test code with one or more test cases on the test data slice (step 710). Determine if there are additional slices of test data (step 720). If there are additional slices (step 730=yes) then modify the base offset to point to the next test data slice (step 740) and return to step 710. When there are no additional slices (step 730=no) then check the results (step 750) of testing the memory cache. The method 700 is then done.

The disclosure and claims herein relate to a system for replicating test data into a memory cache with non-naturally aligned data boundaries while preserving double word and quad word boundaries in segments of the replicated test data to allow test cases to be generated for a section of memory and then replicated throughout the memory to reduce the time needed to generate test cases for testing a processor.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A computer-implemented method executed by at least one processor for testing a computer processor device comprising:
   providing test data comprising a plurality of segments of test data that when placed consecutively in a memory together make a slice of test data, wherein each of the plurality of segments making up the slice of test data fill a portion of the memory comprising a plurality of cache lines of the memory; wherein the plurality of test segments are non-naturally aligned where the beginning and ending of each of the plurality of segments when placed consecutively in a memory do not line up with a cache line boundary, wherein the plurality of segments comprise an odd number of words where the odd number is chosen from 5, 7, 9, and 11;

placing multiple instances of the slice of test data in consecutive locations in a cache memory; and running a test code on the consecutive slices of test data with non-naturally aligned boundaries by branching back to rerun the test code on each of the slices of test data.

2. The method of claim 1 wherein the step of running a test code on the consecutive slices of test data with non-naturally aligned boundaries further comprises:

executing test code with one or more test cases on a first slice of test data of the plurality of test data slices using a base offset;

determining if there are additional slices of test data; and where there are additional slices of test data, modifying the base offset to point to a next test data slice and branching back to execute the test code with the modified base offset.

3. The method of claim 1 wherein the plurality of segments of test data comprises sub-segments of test data that include word, double word and quad word sub-segments.

4. The method of claim 3 wherein sub-segments in subsequent segments of the test data are arranged in different orders.

5. The method of claim 1 wherein each segment includes one single word, one double word and one quad word sub-segment.

6. The method of claim 1 wherein the slice of test data further comprises a plurality of strands of test cases that each comprise a plurality of segments.

7. The method of claim 6 wherein the plurality of strands comprises five strands with four segments in each strand with each segment having seven words of test data with four bytes in each word.

8. The apparatus of claim 1 wherein the plurality of segments are non-naturally aligned where the beginning and ending of each of the segments does not line up with a page crossing boundary.

9. The apparatus of claim 1 wherein the plurality of segments are non-naturally aligned where the beginning and ending of each of the segments does not line up with a 32 byte boundary.

10. A computer-implemented method executed by at least one processor for testing a computer processor device comprising:

providing test data comprising a plurality of segments of test data that when placed consecutively in a memory together make a slice of test data, wherein each of the plurality of segments making up the slice of test data fill a portion of the memory comprising a plurality of cache lines of the memory; wherein the plurality of test segments are non-naturally aligned where the beginning and ending of each of the plurality of segments when placed consecutively in a memory do not line up with a cache line boundary, wherein the plurality of segments comprise one single word, one double word and one quad word sub-segment, wherein sub-segments in subsequent segments of the test data are arranged in different orders;

placing multiple instances of the slice of test data in consecutive locations in a cache memory; and running a test code on the consecutive slices of test data with non-naturally aligned boundaries by branching back to rerun the test code on each of the slices of test data.

* * * * *